United States Patent
Chou

(10) Patent No.: US 10,094,048 B2
(45) Date of Patent: Oct. 9, 2018

(54) METHOD OF PRODUCING DOUBLE-DOPED SCINTILLATION CRYSTAL

(71) Applicant: NATIONAL SUN YAT-SEN UNIVERSITY, Kaohsiung (TW)

(72) Inventor: Ming-Chi Chou, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 15/252,231

(22) Filed: Aug. 31, 2016

(65) Prior Publication Data

US 2017/0088977 A1 Mar. 30, 2017

(30) Foreign Application Priority Data

Sep. 25, 2015 (TW) .............................. 104132027 A

(51) Int. Cl.
| | |
|---|---|
| C30B 33/02 | (2006.01) |
| C30B 15/04 | (2006.01) |
| C30B 29/34 | (2006.01) |
| G01T 1/202 | (2006.01) |

(52) U.S. Cl.
CPC .............. *C30B 33/02* (2013.01); *C30B 15/04* (2013.01); *C30B 29/34* (2013.01); *G01T 1/2023* (2013.01)

(58) Field of Classification Search
CPC combination set(s) only.
See application file for complete search history.

(56) References Cited

U.S. PATENT DOCUMENTS 4,030,965 A * 6/1977 Hammond .............. C30B 11/00
117/83

7,151,261 B2 † 12/2006 Chai
7,397,034 B2 7/2008 Chai et al.
9,175,420 B2 † 11/2015 Andreaco
2002/0144640 A1 * 10/2002 Andreaco .............. C30B 33/00
117/2
2006/0266276 A1 † 11/2006 Shimura (Continued)

FOREIGN PATENT DOCUMENTS

| CN | 103249805 A | 8/2013 |
|---|---|---|
| CN | 104508192 A | 4/2015 |

OTHER PUBLICATIONS

Zavartsev et al. Czochralski growth and characterisation of large Ce3+:Lu2SiO5 single crystals co-doped with Mg2+ or Ca2+ or Tb3+ for scintillators, Journal of Crystal Growth 275 (2005) e2167-e2171.*

(Continued)

*Primary Examiner* — Erin Flanagan Bergner
(74) *Attorney, Agent, or Firm* — CKC & Partners Co., Ltd.

(57) ABSTRACT

A method of producing a double-doped scintillation crystal is provided. Czochralski method is used to grow a double-doped single crystal boule. The double-doped single crystal boule is a single crystal boule of rare-earth silicate double-doped with cerium (Ce) and calcium (Ca) or magnesium (Mg). The double-doped single crystal boule is subjected to a thermal annealing process in a furnace. A yield of pixel samples of the double-doped scintillation crystal is improved after a processing process, and the present invention achieves low producing cost, high yield, less crystal fragmentations, high luminescence intensity and short decaying time.

4 Claims, 2 Drawing Sheets

(56) References Cited

U.S. PATENT DOCUMENTS

| | | | |
|---|---|---|---|
| 2009/0136731 A1* | 5/2009 | Tatartchenko | C30B 29/34 428/220 |
| 2014/0099465 A1† | 4/2014 | Zerrouk | |
| 2014/0291580 A1† | 10/2014 | Zagumennyi | |

OTHER PUBLICATIONS

Tyagi et al., Effect of Ca2+Co-Doping on the Temperature Dependence of Gd2SiO5 : Ce Photoluminescence, 973-978, Apr. 2013, IEEE Transactions on Nuclear Science, vol. 60, No. 2.†

Shimizu et al., Effect of Mg-, Zr-, and Ta-Doping on Scintillation Properties of Gd2SiO5: Ce Crystal, 778-781, Aug. 2003, IEEE Transactions on Nuclear Science, vol. 50, No. 4.†

Zavartsev et al., Czochralski growth and characterisation of large Ce3+:Lu2SiO5 single crystals co-doped with Mg2+ or Ca2+ or Tb3+ for Scintillators, e2167-e2171, 2005, Journal of Crystal Growth 275.†

\* cited by examiner
† cited by third party

METHOD OF PRODUCING DOUBLE-DOPED SCINTILLATION CRYSTAL

RELATED APPLICATIONS

This application claims priority to Taiwan Application Serial Number TW 104132027, filed Sep. 25, 2015, which is herein incorporated by reference.

BACKGROUND

Field of Invention

The present invention relates to a method of producing a double-doped scintillation crystal, and more particularly a method of producing a scintillation crystal of rare-earth silicate double-doped with cerium (Ce) and calcium (Ca) or magnesium (Mg). The method especially comprises a thermal annealing process under atmospheric condition, in which the double-doped scintillation crystal obtained from the method has a high yield, less crystal fragmentations, high luminescence intensity and a short decaying time with h a low producing cost.

Description of Related Art

Now, one of widely used scintillation crystal is a rare-earth silicate crystal, especially the cerium-doped lutetium silicate ($Ce:Lu_2SiO_5$, LSO). But, after being annealed, most of cerium ions of the crystals are tetravalent $Ce^{4+}$ due to having no other co-doped ions, leading to reduced luminescence and yellowing crystals.

In the past, the raw material of rare-earth silicate has low purity (mostly 99.95 percents (%)), and thus the raw material itself contains a small amount of impurities like Ca, Mg and other elements. However, concentrations of the above impurities are too low to be quantitatively analyzed, and crystal quality is often unstable. U.S. Pat. No. 7,397,034 disclosed a method of enhancing performance of doped scintillation crystals, in which the colorless and transparent crystals were formed by thermal oxygenation. Nevertheless, yellowing still occurs often, thus it is difficult to control the quality of the crystals. However, the purification technologies of raw materials have been greatly progressed nowadays. The purity of raw material may reach 99.995~99.999%. Therefore, if the crystal is not doped with other ions, most of the crystals will turn yellow, leading to reduced luminescence and longer decaying time. Currently, the luminescence of doped scintillation crystals may be seven times more than conventional Bismuth Germanate (BGO), and the decaying time can achieve 35~50 nanoseconds (nsec). Therefore, in view of industrial production, the crystal has to be co-doped with other ions.

As described above, the scintillation crystal of the patent U.S. Pat. No. 7,397,034 was formed by doping lutetium silicate with cerium. Thereafter, the scintillation crystal was cut into pixel samples with specific size, followed by the thermal oxygenation to let oxygen diffuse into the scintillation crystal and make tetravalent cerium ($Ce^{4+}$) became trivalent cerium ($Ce^{3+}$). Although the pixel samples of the scintillation crystal have a decaying time of 48 nsec, the obtained pixel samples of the crystal sometimes still turn yellow; and it is hard to control the yield and the oxygen concentration of the pixel samples of the scintillation crystal. Besides, in order to keep the uniformity of luminescence of the crystal, each of the pixel samples has to be subjected to the thermal oxygenation separately. What's more, each of the pixel samples has to be processed to remove the oxide layer formed on the surface of itself during the thermal annealing treatment, so as to increase the luminescence. However, the loss rate of the pixel samples of the crystal may increase during the oxide-layer removing step. As a result, currently conventional methods are obviously not economic for causing a decreasing yield of the pixel samples and a higher producing cost.

Furthermore, if the pixel samples of the crystal of the aforementioned patent are thermally treated in nitrogen atmosphere for excluding oxygen gas, a nitride film will be formed on the crystal surface. In order to remove the nitride film, etching will be required, which increases undesired process steps and is undesirable. Moreover, if the aforementioned patent uses hydrogen gas, mixed oxygen and hydrogen gases may possibly cause undesired explosion, which is still not desirable.

Hence, the prior art does not fulfill all users' requests on actual use. It is necessary to develop a method of producing the double-doped scintillation crystal, in which a yield and luminescence intensity of the double-doped scintillation crystal can be improved.

SUMMARY

The main purpose of the present invention is to overcome the above problems of the prior arts, and provide a method of producing a double-doped scintillation crystal. The method comprises a thermal annealing process under an atmospheric condition without considering the oxygen concentration. Fragmentation of the double-doped scintillation crystal occurred during a processing process (e.g. a grinding step, a polishing step and/or a cutting step) is reduced by the thermal annealing process, so as to increase a yield of pixel samples of the double-doped scintillation crystal. Therefore, the method of the present invention can achieve a high yield of the double-doped scintillation crystal, less crystal fragmentations, high luminescence intensity and a short decaying time with a low producing cost.

Another purpose of the present invention is to provide a method of producing the double-doped scintillation crystal, in which the entire double-doped single crystal boule is subjected to the thermal annealing process rather than pixel samples of the double-doped single crystal boule. Therefore, the oxygen concentration is not concerned, and the Ce in the entire double-doped single crystal boule becomes $Ce^{3+}$, instead of $Ce^{4+}$, in existence of doped Ca or Mg.

To achieve the above purposes, the present invention is a method of producing a double-doped scintillation crystal, at least comprising steps of: (A) growing a double-doped single crystal boule by Czochralski method, in which the double-doped single crystal boule is a single crystal boule of rare-earth silicate doped with cerium (Ce) and an element selected from the group consisting of calcium (Ca) and magnesium (Mg), said element makes tetravalent cerium ($Ce^{4+}$) become trivalent cerium ($Ce^{3+}$) by charge compensation; and (B) performing a thermal annealing process by placing the double-doped single crystal boule in a furnace, so as to form the double-doped scintillation crystal boule. The thermal annealing process comprises a heating step, a temperature-sustaining step and a cooling step, in which the double-doped single crystal boule is heated from a room temperature to a temperature of 1400° C.~1600° C. in 480 minutes (mins)~720 mins during the heating step. The temperature-sustaining step is to maintain the temperature of the double-doped single crystal boule at 1400° C.~1600° C. for 50 hours (hrs)~200 hrs. The cooling step is to cool down the double-doped single crystal boule from 1400° C.~1600° C. to a room temperature in 480 mins~720 mins.

According to an embodiment of the present invention, the rare-earth silicate is selected from the group consisting of lutetium oxyorthosilicate (LSO), lutetium yttrium oxyorthosilicate (LYSO), yttrium oxyorthosilicate (YSO), lutetium gadolinium oxyorthosilicate (LGSO) and lutetium gadolinium yttrium oxyorthosilicate (LGYSO).

According to an embodiment of the present invention, after the thermal annealing process, the method further comprises subjecting the double-doped scintillation crystal boule to a processing process, thereby forming pixel samples of the double-doped scintillation crystal boule.

According to an embodiment of the present invention, the processing process comprises a cutting step, a grinding step, and a polishing step.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
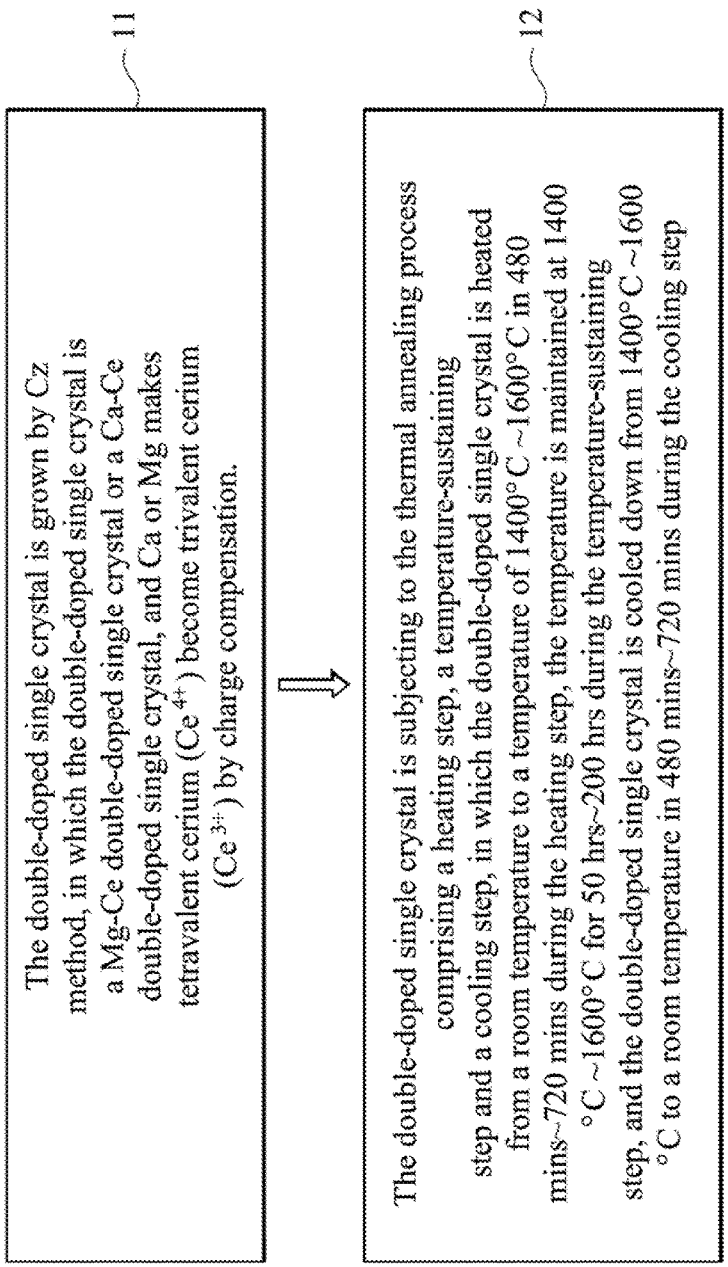
FIG. 1 is a flow view of the method of present invention according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
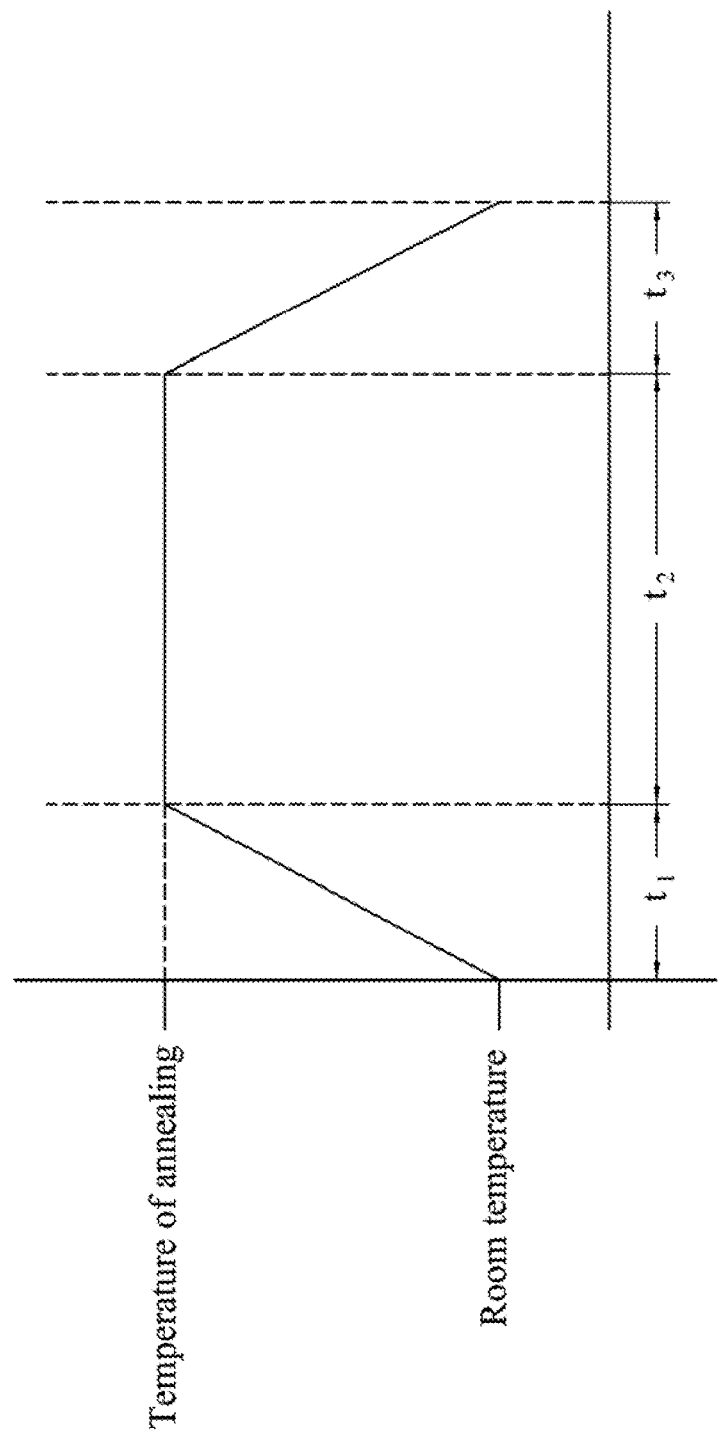
FIG. 2 is the view showing the temperature curve of the thermal annealing process.

Please refer to FIG. 1 and FIG. 2, in which FIG. 1 illustrates a flow chart of the method of producing the double-doped scintillation crystal according to an embodiment of the present invention, and FIG. 2 illustrates a view showing a temperature curve of a thermal annealing process according to an embodiment of the present invention. As shown in FIG. 1, the present invention is a method of producing a double-doped scintillation crystal, and the method comprises the following step (A) and step (B).

(A) forming a double-doped single crystal boule 11: a double-doped single crystal boule is grown by Czochralski (Cz) method. The double-doped single crystal boule is a single crystal boule of rare-earth silicate double-doped with cerium (Ce) and calcium (Ca) or magnesium (Mg). To be specifically, Ca or Mg makes tetravalent cerium ($Ce^{+4}$) become trivalent cerium ($Ce^{+3}$) by charge compensation, thereby forming a Ca/Ce double-doped single crystal boule or a Mg/Ce double-doped single crystal boule.

(B) performing a thermal annealing process 12: the double-doped single crystal boule is placed in a furnace for performing the thermal annealing process, so as to form the double-doped scintillation crystal boule. The thermal annealing process comprises a heating step, a temperature-sustaining step and a cooling step. The double-doped single crystal boule is heated from a room temperature to a temperature of 1400° C.~1600° C. in 480 mins~720 mins during the heating step. Then, the temperature of the double-doped single crystal boule is maintained at 1400° C.~1600° C. for 50 hrs~200 hrs during the temperature-sustaining step. Finally, the double-doped single crystal boule cooled down from 1400° C.~1600° C. to the room temperature in 480 mins~720 mins during the cooling step. A whole new method of producing the double-doped scintillation crystal is constructed based on the disclosed steps shown above.

In one embodiment, after the thermal annealing process, the method of the present invention can further comprise subjecting the double-doped scintillation crystal boule to a processing process, so as to form pixel samples of the double-doped scintillation crystal boule. In one embodiment, the processing process comprises a cutting step, a grinding step and a polishing step.

It is noted that the method of the present invention excludes a step for removing an oxide layer formed on the surface of the double-doped scintillation crystal boule. The processing process is for forming the pixel samples rather than removing the oxide layer, and thus the higher yield of the pixel samples and less crystal fragmentations can be achieved by applying the present method.

In one embodiment, the Cz method may be performed at around 2150° C. to form the double-doped single crystal boule of rare-earth silicate. If the temperature of the Cz method is higher than 2200° C., the double-doped single crystal boule of rare-earth silicate can't be formed.

The rare-earth silicate is selected from the group consisting of lutetium oxyorthosilicate (LSO), lutetium yttrium oxyorthosilicate (LYSO), yttrium oxyorthosilicate (YSO), lutetium gadolinium oxyorthosilicate (LGSO) and lutetium gadolinium yttrium oxyorthosilicate (LGYSO).

LYSO double-doped with Ce and Ca (Ca+Ce:LYSO) is taken as an example. When the method of the present invention is applied, a double-doped single crystal boule of Ca+Ce:LYSO is grown by Cz method. Then, the double-doped single crystal boule of Ca+Ce:LYSO is placed in the furnace to perform the thermal annealing process. Therein, the double-doped single crystal boule of Ca+Ce:LYSO is heated from a room temperature to a temperature of 1400° C.~1600° C. in 600 mins (i.e. the time of the heating step, shown as $t_1$ of FIG. 2). Then, the temperature of the double-doped single crystal boule is maintained at 1400° C.~1600° C. for 50 hr~200 hr (i.e. the time of the temperature-sustaining step, shown as $t_2$ of FIG. 2). Finally, the double-doped single crystal boule is cooled down from 1400° C.~1600° C. to a room temperature in 600 mins (i.e. the time of the cooling down step, shown as $t_3$ of FIG. 2), and the method of producing the double-doped scintillation crystal boule is completed.

In the above example, the double-doped scintillation crystal of the present invention can be composed of elements shown in formula (I) or formula (II):

$$Ca_x+Ce_y:Lu_{2-x-y-z}Y_zSiO_5 \quad \text{(I)}$$

$$Mg_x+Ce_y:Lu_{2-x-y-z}Y_zSiO_5 \quad \text{(II)}$$

in the formula (I) and formula (II), x is more than 0.00001 to less than 0.005, y is more than 0.001 to less than 0.1, and z is equal to or greater than 0.05 less than 1.898.

The main technique of the present invention is performing the thermal annealing process to the double-doped single crystal under the atmospheric condition, thereby significantly reducing crystal fragmentations of the double-doped scintillation crystal occurred during the processing process. Since an annealing temperature (i.e. the temperature of the temperature-sustaining step) is related to thermal expansion coefficient (TEC) and thermal conductivity, two main deteriorations leading to fragmentation of the double-doped scintillation crystal (i.e. dislocation and surface roughness of the double-doped scintillation crystal) are inhibited by performing the thermal annealing process to the double-doped single crystal boule. However, the variances of the thermal expansion coefficient and thermal conduction will increase at a temperature higher than 1600° C., and the thermal expansion coefficient will become highly anisotropic along the a-, b- and c-axis, thus the crystal would be fragmented once the annealing temperature exceeds 1600° C.

In addition, if the time (shown as $t_1$ of FIG. 2) of the heating step and the time (shown as $t_3$ of FIG. 2) of the cooling step are too short, or the time (shown as $t_2$ of FIG. 2) of the temperature-sustaining step is not enough, thermal stress in the double-doped single crystal boule can't be completely released, leading to the fragmentation of the double-doped scintillation crystal when the processing process is performed.

Furthermore, the purpose of the thermal annealing process of the present invention is to improve the yield of pixel samples of the double-doped scintillation crystal boule after being processed (e.g. the grinding step, the polishing step and/or the cutting step). Therefore, an entire double-doped single crystal boule, rather than the pixel samples of the double-doped single crystal boule, is subject to the thermal annealing process. As a result, a loss rate of the pixel samples of the double-doped scintillation crystal boule is reduced. In addition, the oxygen concentration is not concerned, since Ce in the double-doped single crystal boule has already become $Ce^{3+}$, instead of $Ce^{4+}$ by doping Ca or Mg into the double-doped single crystal boule. Thus, the present invention achieves a low producing cost, a high yield, less crystal fragmentations, high intensity and a short decaying time.

A detailed description of the present ray ration is shown by the following comparison examples and examples. It is noted that the double-doped scintillation crystals of the following examples have a composition shown as formula (III):

$$Ca_{0.003}Ce_{0.095}:Lu_{1.652}Y_{0.05}SiO_5 \qquad (III)$$

COMPARISON EXAMPLE 1

Ca+Ce:LYSO double-doped single crystal formed by Cz method on different batches were subjected to the thermal annealing process in Comparison example 1. Detailed descriptions are as follows. Ten double-doped single crystal boules of Ca+Ce:LYSO were grown by Cz method. Each one of the crystal boules had a diameter of 70 millimeters (mm) and a length of 200 mm. The crystal boules were subjected to the thermal annealing process in the furnace, in which the crystal boules were heated from the room temperature (25° C.) to 1610° C. in 600 minutes, the temperature of the crystal boules was maintained at 1610° C. for 100 hrs, and then the crystal boules were cooled down from 1610° C. to the room temperature in 600 mins. Five crystal boules were polished and cut into pixel samples of 3.9 mm×3.9 mm×20 mm, and the other five crystal boules were processed into pixel samples of 1.51 mm×1.51 mm×10 mm. Amounts of Ca+Ce:LYSO pixel samples obtained from these crystal boules, the yield and the luminescence intensity are listed in Table 1 and Table 2, in which Table 1 stands for the 3.9 mm×3.9 mm×20 mm pixel samples of the Ca+Ce:LYSO scintillation crystal boules; and Table 2 stands for the 1.51 mm×1.51 mm×10 mm pixel samples of the Ca+Ce:LYSO scintillation crystal boules.

TABLE 1

| | Sample # | | | | |
|---|---|---|---|---|---|
| | 1 | 2 | 3 | 4 | 5 |
| Pixel # | 702 | 801 | 684 | 829 | 729 |
| Yield % | 30.46 | 34.76 | 29.69 | 35.93 | 31.64 |

TABLE 1-continued

| | Sample # | | | | |
|---|---|---|---|---|---|
| | 1 | 2 | 3 | 4 | 5 |
| Luminescence intensity (%) | 70.52 | 65.67 | 87.85 | 76.53 | 78.42 |

TABLE 2

| | Sample # | | | | |
|---|---|---|---|---|---|
| | 1 | 2 | 3 | 4 | 5 |
| Pixel # | 11050 | 11390 | 11526 | 11815 | 11628 |
| Yield % | 37.60 | 38.78 | 39.24 | 40.22 | 39.60 |
| Luminescence intensity (%) | 64.56 | 88.62 | 73.85 | 85.45 | 74.58 |

COMPARISON EXAMPLE 2

Comparison example 2 was performed in the same way of the Comparison example 1 did, while the conditions of the thermal annealing process was shown as below: the temperature of the heating step increased from the room temperature to 1520° C. in 399 minutes, the temperature-sustaining step was performed at a temperature of 1520° C. for 100 hrs and the temperature of the cooling step decreased from 1520° C. to the room temperature in 720 minutes. The double-doped scintillation crystal boules of Comparison example 2 were then processed as Comparison example 1 did. Amounts of Ca+Ce:LYSO pixel samples obtained from these crystal boules, the yield and the luminescence intensity are listed in Table 3 and Table 4, in which Table 3 stands for the 3.9 mm×3.9 mm×20 mm pixel samples of the Ca+Ce:LYSO scintillation crystal boules; and Table 4 stands for the 1.51 mm×1.15 mm×10 mm pixel samples of the Ca+Ce:LYSO scintillation crystal boules.

TABLE 3

| | Sample # | | | | |
|---|---|---|---|---|---|
| | 1 | 2 | 3 | 4 | 5 |
| Pixel # | 550 | 696 | 634 | 583 | 710 |
| Yield % | 24.19 | 30.58 | 27.88 | 25.64 | 31.17 |
| Luminescence intensity (%) | 90.23 | 85.43 | 93.60 | 83.50 | 79.54 |

TABLE 4

| | Sample # | | | | |
|---|---|---|---|---|---|
| | 1 | 2 | 3 | 4 | 5 |
| Pixel # | 8032 | 9503 | 8806 | 7786 | 9724 |
| Yield % | 28.01 | 33.14 | 30.71 | 27.15 | 33.91 |
| Luminescence intensity (%) | 88.32 | 90.47 | 95.78 | 80.62 | 74.53 |

COMPARISON EXAMPLE 3

Comparison example 3 was performed in the same way of Comparison example 1 did, while the conditions of the thermal annealing process was shown as below: the temperature of the heating step increased from the room temperature to 1520° C. in 720 minutes, the temperature-sustaining step was performed at a temperature of 1520° C. for 30 hrs, and the temperature of the cooling step decreased from 1520° C. to the room temperature in 70 minutes. The double-doped scintillation crystal boules of Comparison example 3 were then processed as Comparison example 1 did. Amounts of Ca+Ce:LYSO pixel samples obtained from these crystal boules, the yield and the luminescence intensity are listed in Table 5 and Table 6, in which Table 5 stands for the 3.9 mm×3.9 mm×20 mm pixel samples of the Ca+Ce:LYSO scintillation crystal boules; and Table 6 stands for the 1.51 mm×1.51 mm×10 mm pixel samples of the Ca+Ce:LYSO scintillation crystal boules.

TABLE 5

| | Sample # | | | | |
|---|---|---|---|---|---|
| | 1 | 2 | 3 | 4 | 5 |
| Pixel # | 248 | 270 | 310 | 297 | 264 |
| Yield % | 10.90 | 11.86 | 13.62 | 13.05 | 11.60 |
| Luminescence intensity (%) | 70.53 | 84.30 | 75.60 | 64.96 | 80.67 |

TABLE 6

| | Sample # | | | | |
|---|---|---|---|---|---|
| | 1 | 2 | 3 | 4 | 5 |
| Pixel # | 4420 | 4556 | 4610 | 4726 | 4651 |
| Yield % | 15.41 | 15.89 | 16.08 | 16.48 | 16.22 |
| Luminescence intensity (%) | 72.34 | 80.54 | 65.32 | 69.48 | 75.53 |

EXAMPLE 1

Ca+Ce:LYSO double-doped single crystal formed by Cz method on different batches were subjected to the thermal annealing process in Example 1. Detailed descriptions are as follows. Ten single crystal boules of Ca+Ce:LYSO were grown by Cz method. Each one of the crystal boules had a diameter of 70 mm and a length of 200 mm. The crystal boules were subjected to the thermal annealing process in the furnace, in which the crystal boules were heated from the room temperature to 1520° C. in 600 minutes, the temperature of the crystal boules was maintained at a temperature of 1520° C. for 100 hrs, and then the crystal boules were cooled down from 1520° C. to the room temperature in 600 min. Five crystal boules were cut and polished into pixel samples of 3.9 mm×3.9 mm×20 mm and the other five crystal boules were processed into the pixel samples of 1.51 mm×1.51 mm×10 mm. Amounts of Ca+Ce:LYSO pixel samples obtained from these crystal boules, the yield and the luminescence intensity are listed in Table 7 and Table 8, in which Table 7 stands for the 3.9 mm×3.9 mm×20 mm pixel samples cut from the Ca+Ce:LYSO scintillation crystal boules; and Table 8 stands for the 1.51 mm×1.51 mm×10 mm pixel samples cut from the Ca+Ce:LYSO scintillation crystal boules.

TABLE 7

| | Sample # | | | | |
|---|---|---|---|---|---|
| | 1 | 2 | 3 | 4 | 5 |
| Pixel # | 1341 | 1503 | 1386 | 1422 | 1458 |
| Yield % | 58.20 | 65.20 | 60.15 | 61.71 | 63.28 |
| Luminescence intensity (%) | 93.58 | 98.72 | 99.76 | 97.43 | 95.56 |

TABLE 8

| | Sample # | | | | |
|---|---|---|---|---|---|
| | 1 | 2 | 3 | 4 | 5 |
| Pixel # | 14790 | 16405 | 17034 | 15963 | 15215 |
| Yield % | 51.60 | 57.24 | 59.43 | 55.70 | 53.08 |
| Luminescence intensity (%) | 98.77 | 96.43 | 99.30 | 92.10 | 100.0 |

EXAMPLE 2

Example 2 was performed in the same way of Example 1 did, while the conditions of the thermal annealing process was shown as below: the temperature of the heating step increased from the room temperature to 1400° C. 540 minutes, the temperature-sustaining step was performed at a temperature of 1400° C. for 100 hrs, and the temperature of the cooling step decreased from 1400° C. to the room temperature in 540 minutes. The double-doped scintillation crystal boules of Example 2 were then processed as Example 1 did. Amounts of Ca+Ce:LYSO pixel samples obtained from these crystal boules are listed in Table 9 and Table 10, in which Table 9 stands for the 3.9 mm×3.9 mm×20 mm pixel samples of the Ca+Ce:LYSO scintillation crystal boules; and Table 10 stands for the 1.51 mm×1.51 mm×10 mm pixel samples of the Ca+Ce:LYSO scintillation crystal boules.

TABLE 9

| | Sample # | | | | |
|---|---|---|---|---|---|
| | 1 | 2 | 3 | 4 | 5 |
| Pixel # | 1248 | 1218 | 1281 | 1314 | 1297 |
| Yield % | 54.84 | 53.51 | 56.28 | 57.73 | 57.01 |
| Luminescence intensity (%) | 100.0 | 97.53 | 98.37 | 96.45 | 100.0 |

TABLE 10

| | Sample # | | | | |
|---|---|---|---|---|---|
| | 1 | 2 | 3 | 4 | 5 |
| Pixel # | 14897 | 14461 | 17001 | 15872 | 16725 |
| Yield % | 51.95 | 50.43 | 59.30 | 55.35 | 58.32 |
| Luminescence intensity (%) | 95.63 | 97.43 | 99.81 | 88.42 | 90.32 |

EXAMPLE 3

Example 3 was performed in the same way of Example 1 did, while the conditions of the thermal annealing process was shown as below: the temperature of the heating step increased from the room temperature to 1520° C. in 480 minutes, the temperature-sustaining step was performed at temperature of 1520° C. for 100 hrs, and the temperature of the cooling step decreased from 1520° C. to the room temperature in 480 minutes. The double-doped scintillation crystal boules of Example 3 were then processed as Example 1 did. Amounts of Ca+Ce:LYSO pixel samples obtained from these crystal boules are listed in Table 11 and Table 12, in which Table 11 stands for the 3.9 mm×3.9 mm×20 mm pixel samples of the Ca+Ce:LYSO scintillation crystal boules; and Table 12 stands for the 1.51 mm×1.51 mm×10 mm pixel samples of the Ca+Ce:LYSO scintillation crystal boules.

TABLE 11

| | Sample # | | | | |
|---|---|---|---|---|---|
| | 1 | 2 | 3 | 4 | 5 |
| Pixel # | 1174 | 1368 | 1251 | 1324 | 1186 |
| Yield % | 51.6 | 60.1 | 54.96 | 58.19 | 52.13 |
| Luminescence intensity (%) | 96.54 | 98.72 | 88.56 | 89.42 | 95.43 |

TABLE 12

| | Sample # | | | | |
|---|---|---|---|---|---|
| | 1 | 2 | 3 | 4 | 5 |
| Pixel # | 14535 | 15937 | 15447 | 15015 | 15923 |
| Yield % | 50.68 | 55.57 | 53.86 | 52.39 | 55.52 |
| Luminescence intensity (%) | 89.47 | 94.69 | 97.58 | 92.35 | 95.44 |

Evaluation
1. Yield:

The yield of the present invention represents the percentage of the pixel samples relative to the double-doped scintillation crystal boules that are not subjected to the processing process as 100%. The yield can be measured by the formula (IV) shown below.

Yield=The weight of all the pixel samples/the weight of the unprocessed double-doped scintillation crystal boules×100%   (IV)

2. Luminescence Intensity:

The luminescence intensity is measured by a photomultiplier with a multi-channel digital signal analyzer and a data processor. The source of the photomultiplier is cesium (Cs)-137, and a distance between the pixel samples and the source is 10 centimeters. Theoretical luminescence intensity of the pixel samples is set to be 100% and relative luminescence intensity of the pixel samples of the present invention is measured based on the theoretical luminescence intensity.

According to Examples of Table 7 to Table 12, the double-doped single crystal boules are formed by the Cz method, subjected to the specific thermal annealing process and processed into pixel samples of the double-doped scintillation crystal boules, in which the pixel samples have high yield and luminescence intensity.

However, according to Comparison examples of Table 1 to Table 6, the yield and the luminescence intensity decrease when the temperature of the temperature-sustaining step is too high, the time of the heating step and the cooling step is too short, or the time of the temperature-sustaining step is not enough.

As the above results show, if the annealing temperature is higher than 1600° C., the average yield is 30 percents (%). If the annealing temperature is below 1600° C., the average yield can be as high as 60%, which is significantly much higher than 30%.

To sum up, the present invention is a method of producing a double-doped scintillation crystal to overcome the various problems of the prior arts, wherein the thermal annealing process is performed under the atmospheric condition, thereby significantly reducing crystal fragmentations occurred during the processing process, improving the yield of pixel samples after the processing process. The method of the present invention achieves a low producing cost, a high yield, less crystal fragmentations, high luminescence intensity and a short decaying time. The present invention may be more prospective, more practical and more applicable for the requirements of users than the prior arts, and thus the present invention should satisfy the patentability, thereby applying for a patent according to the patent act.

The preferred embodiment disclosed herein is not intended to unnecessarily limit the scope of the invention. Therefore, equivalent and simple modifications or variations according to the scope of the claims and the specification disclosed herein for a patent are all in the scope of the present invention.

What is claimed is:

1. A method of producing a double-doped scintillation crystal, comprising steps of:
   (A) growing a double-doped single crystal boule by Czochralski method, wherein said double-doped single crystal boule has a diameter of 70 mm and a length of 200 mm, said double-doped single crystal boule is a single crystal boule having general formula (I) or (II), and tetravalent cerium (Ce$^{4+}$) become trivalent cerium (Ce$^{3+}$) by charge compensation, $$Ca_x+Ce_y:Lu_{2-x-y-z}Y_zSiO_5 \quad (I)$$

$$Mg_x+Ce_y:Lu_{2-x-y-z}Y_zSiO_5 \quad (II)$$

in the general formula (I) and (II), x is 0.003, y is more than 0.001 to less than 0.1, and z is equal to or greater than 0.05 to less than 1.898; and
   (B) performing a thermal annealing process by placing the double-doped single crystal boule in a furnace, so as to form said double-doped scintillation crystal boule, wherein said thermal annealing process comprises:
      a heating step, wherein the double-doped single crystal boule is heated from a room temperature to a temperature of 1400° C. ~1600° C. in 480 minutes (mins)~600 mins;
      a temperature-sustaining step, wherein said temperature is maintained at 1400° C. ~1600° C. for 50 hours (hrs)~200 hrs and
      a cooling step, wherein said double-doped single crystal boule is cooled down from 1400° C.~1600° C. to a room temperature in 480 mins ~720 mins.

2. The method of claim 1, wherein said rare-earth silicate is selected from the group consisting of lutetium oxyorthosilicate (LSO), lutetium yttrium oxyorthosilicate (LYSO), yttrium oxyorthosilicate (YSO), lutetium gadolinium oxyorthosilicate (LGSO) and lutetium gadolinium yttrium oxyorthosilicate (LGYSO).

3. The method of claim 1, after the thermal annealing process, further comprising:

subjecting the double-doped scintillation crystal boule to a processing process, thereby forming pixel samples of the double-doped scintillation crystal boule.

4. The method of claim 3, wherein the processing process comprises a cutting step, a grinding step, and a polishing step.

* * * * *